US011069385B1

(12) United States Patent
Li et al.

(10) Patent No.: US 11,069,385 B1
(45) Date of Patent: Jul. 20, 2021

(54) INTEGRATED ASSEMBLIES COMPRISING FOLDED-DIGIT-LINE-CONFIGURATIONS

(71) Applicant: Micron Technology, inc., Boise, ID (US)

(72) Inventors: Jiyun Li, Boise, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/835,797

(22) Filed: Mar. 31, 2020

(51) Int. Cl.
*G11C 11/24* (2006.01)
*G11C 7/08* (2006.01)
*G11C 11/4091* (2006.01)
*H01L 27/108* (2006.01)

(52) U.S. Cl.
CPC ............ *G11C 7/08* (2013.01); *G11C 11/4091* (2013.01); *H01L 27/10805* (2013.01)

(58) Field of Classification Search
CPC .. G11C 7/08; G11C 11/4091; H01L 27/10805
USPC ..................... 365/14, 63, 205, 207
See application file for complete search history.

(56) References Cited

U.S. PATENT DOCUMENTS

| | | | | |
|---|---|---|---|---|
| 6,515,925 B2 * | 2/2003 | Graham | ................... | G11C 7/06 365/205 |
| 6,992,939 B2 * | 1/2006 | Porter | ................... | G11C 29/02 365/189.07 |
| 7,193,914 B2 * | 3/2007 | Yoon | ................... | G11C 7/04 365/205 |
| 7,573,767 B2 * | 8/2009 | Kajigaya | ................... | G11C 8/10 365/207 |
| 8,872,247 B2 * | 10/2014 | Tomishima | ....... | H01L 27/10823 257/300 |
| 10,074,416 B2 * | 9/2018 | Hush | ................... | G11C 7/065 |
| 10,163,906 B2 * | 12/2018 | Miyatake | ................... | G11C 5/025 |
| 10,262,701 B2 * | 4/2019 | Zawodny | ................... | G11C 5/025 |
| 10,347,322 B1 * | 7/2019 | Kim | ................... | G11C 11/221 |
| 10,366,738 B2 * | 7/2019 | Derner | ................... | H01L 27/10814 |
| 10,388,360 B2 * | 8/2019 | Hush | ................... | G11C 7/1006 |
| 10,446,502 B2 * | 10/2019 | Bedeschi | ............ | G11C 11/4091 |
| 10,672,456 B2 * | 6/2020 | Fishburn | ........... | G11C 11/40618 |
| 10,790,286 B2 * | 9/2020 | Juengling | ............ | G11C 11/405 |

(Continued)

OTHER PUBLICATIONS

Hidaka et al., "Twisted Bit-Line Architectures for Multi-Megabit DRAM's", IEEE Journal of Solid-State Circuits, vol. 24, No. 1, Feb. 1989, United States, pp. 21-27.

*Primary Examiner* — Viet Q Nguyen
(74) *Attorney, Agent, or Firm* — Wells St. John P.S.

(57) ABSTRACT

Some embodiments include an integrated assembly having a second deck over a first deck. A first true digit line has first and second segments along the first deck. A first complementary digit line has third and fourth segments along the second deck. The first true digit line is comparatively compared to the first complementary digit line. A second true digit line has a third region along the first deck and a fourth region along the second deck. The third region is adjacent the first segment, and the fourth region is adjacent the third segment. A second complementary digit line has a fifth region along the first deck and has a sixth region along the second deck. The fifth region is adjacent the second segment, and the sixth region is adjacent the fourth segment. The second true digit line is comparatively compared to the second complementary digit line.

24 Claims, 8 Drawing Sheets

(56) References Cited

U.S. PATENT DOCUMENTS

| | | | |
|---|---|---|---|
| 10,796,734 B1 * | 10/2020 | Lam | G11C 11/4091 |
| 10,811,083 B2 * | 10/2020 | Derner | G11C 11/4093 |
| 10,854,276 B2 * | 12/2020 | Kawamura | G11C 7/18 |
| 10,943,642 B2 * | 3/2021 | Derner | H01L 29/7827 |

* cited by examiner

INTEGRATED ASSEMBLIES COMPRISING FOLDED-DIGIT-LINE-CONFIGURATIONS

TECHNICAL FIELD

Memory arrays (e.g., DRAM arrays). Integrated assemblies comprising vertically-stacked decks. Integrated assemblies comprising folded-digit-line-configurations.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit line, sense line, second linear structure, etc.). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

Highly integrated memory has closely-spaced memory cells and digit lines. Problems may be encountered due to undesired capacitive coupling between closely-spaced digit lines (as discussed in the article "Twisted Bit-Line Architectures for Multi-Megabit DRAM's, by H. Hidaka, et. al.; IEEE Journal of Solid-State Circuits, Vol. 24, No. 1, February 1989; pgs. 21-27). The capacitive coupling may lead to excessive noise during data reading operations, and is becoming increasingly problematic with increasing levels of integration. It is desired to develop new architectures which can reduce or eliminate problematic capacitive coupling.

DETAILED DESCRIPTION OF THE ILLUSTRATED EMBODIMENTS

Some embodiments include integrated assemblies having folded-digit-line-configurations. The folded-digit-line-configurations may be provided in arrangements which can reduce or eliminate problematic capacitive coupling. Some conventional assemblies may utilize shielding between adjacent digit lines to reduce problematic capacitive coupling. Embodiments described herein may eliminate problematic coupling without utilizing such shielding. The omission of the shielding may simplify fabrication of the architectures described herein as compared to conventional architectures comprising shielding, and may enable architectures described herein to be formed to tighter packing of adjacent digit lines as compared to architectures having shielding between adjacent digit lines. Example embodiments are described with reference to FIGS. 4-8.

Figure 4:
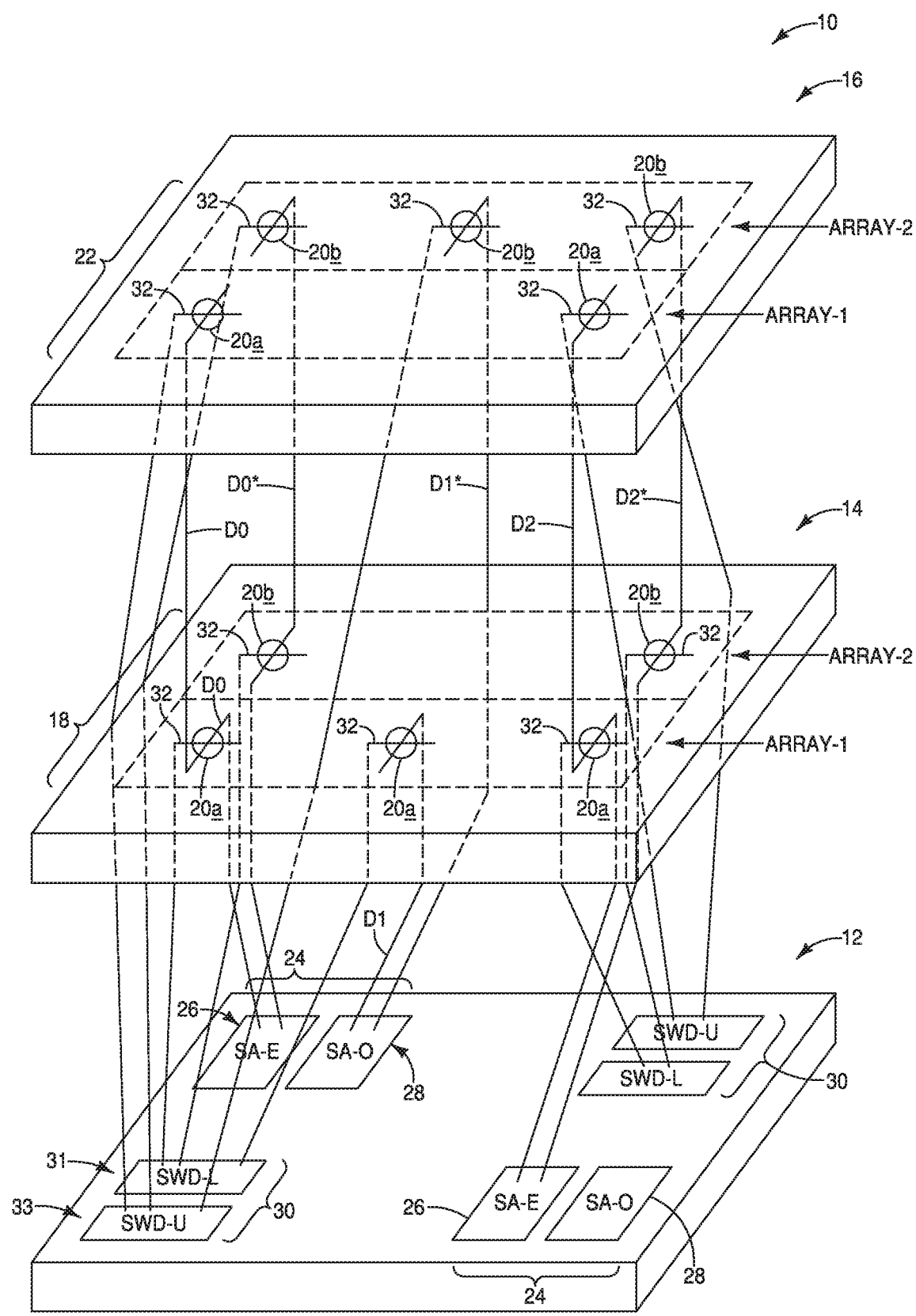
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels (tiers) that are stacked one atop the other. The levels may be within different semiconductor dies, or at least two of the levels may be within the same semiconductor die.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b.

Figure 1:
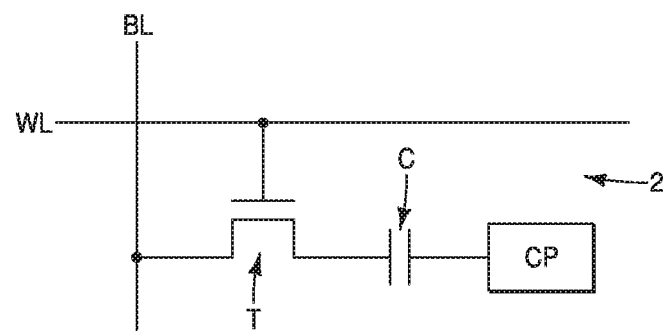
FIG. 1 is a schematic diagram of a prior art memory cell having 1 transistor and 1 capacitor.
Figure 2:
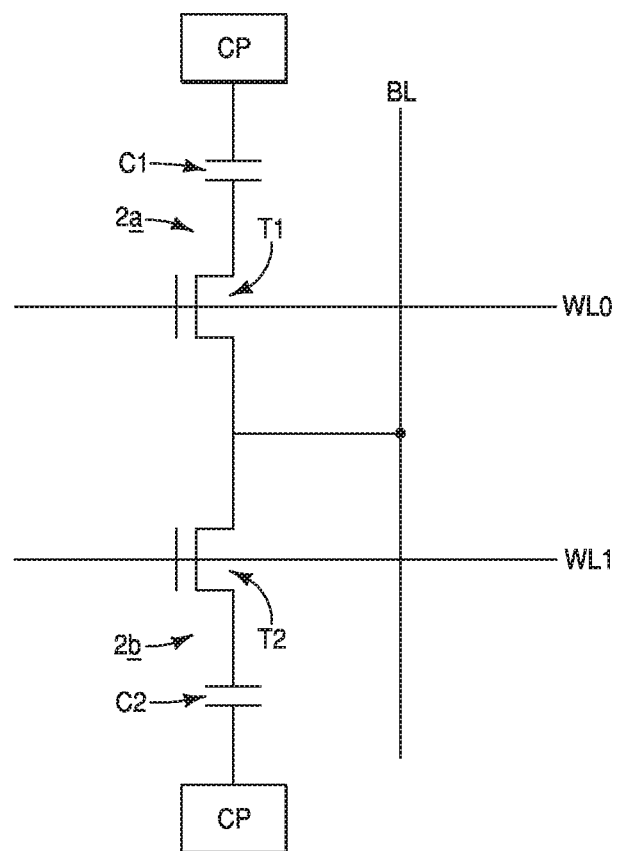
FIG. 2 is a schematic diagram of a pair of prior art memory cells which each have 1 transistor and 1 capacitor, and which share a bitline connection.
Figure 3:
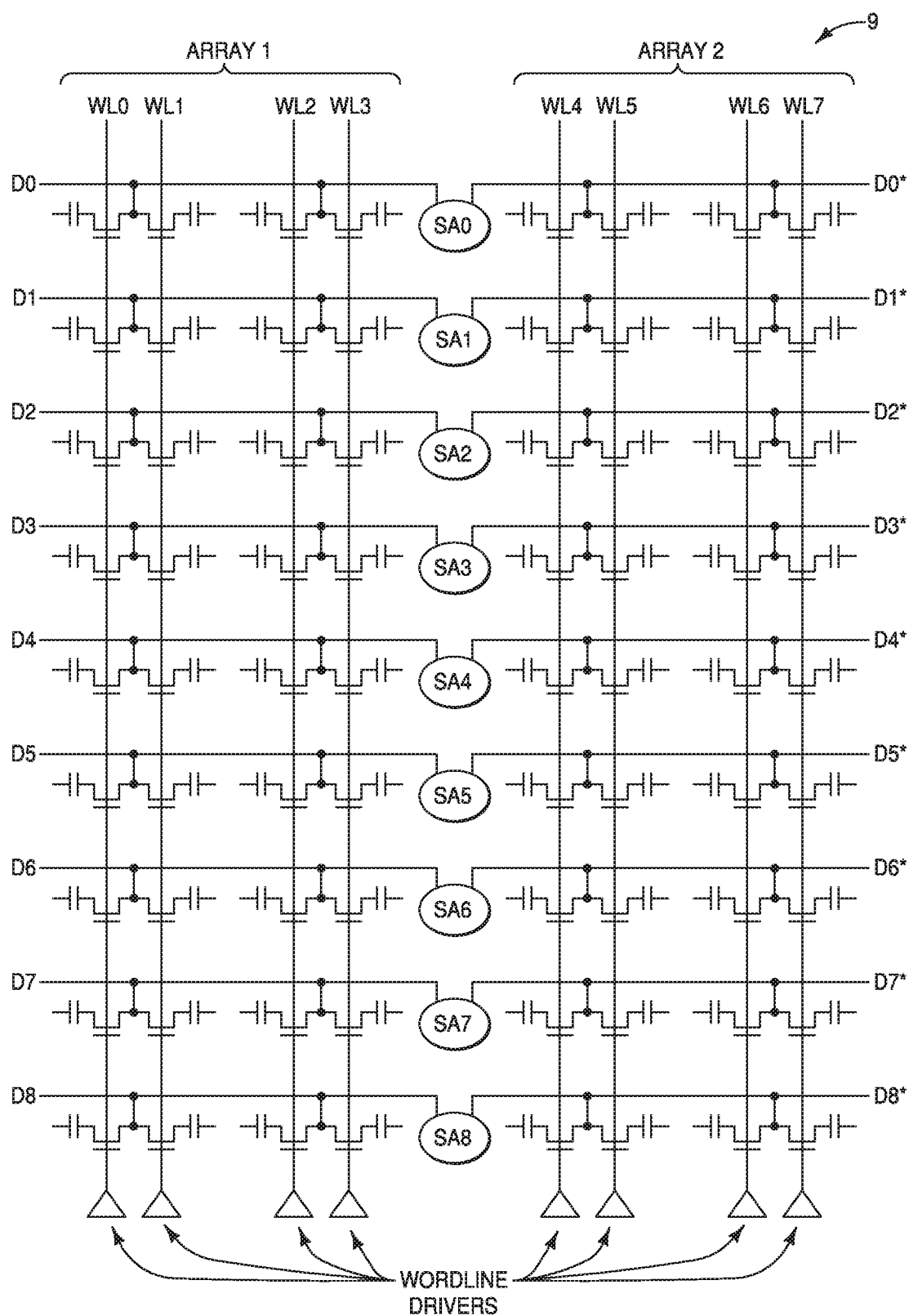
FIG. 3 is a schematic diagram of a prior art integrated assembly having open bitline architecture.

The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays). ARRAY-1 and ARRAY-2 are shown to be separated from one another to simplify the illustration of FIG. 4. In some embodiments, regions of ARRAY-1 may overlap regions of ARRAY-2 as is illustrated in the embodiment described below with reference to FIG. 5.

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA), and WORDLINE DRIVER circuitry (WD).

The SENSE AMPLIFIER circuitry includes regions 26 labeled "SA-E" to identify them as being associated with an "even" portion of a circuit, and regions 28 labeled "SA-O" to identify them as being associated with an "odd" portion of the circuit. The terms "even" and "odd" are arbitrary, and are utilized to distinguish the different sense-amplifier-circuitries from one another. The illustrated configuration has the SENSE AMPLIFIER circuitries SA-O and SA-E paired with one another and distributed as structures 24. The SENSE AMPLIFIER circuitries SA-O and SA-E may be referred to as first and second SENSE AMPLIFIER circuitries, respectively. In some embodiments, the SENSE AMPLIFIER circuitries SA-O may be considered to correspond to a first set of the SENSE AMPLIFIER circuitries, and the SENSE AMPLIFIER circuitries SA-E may be considered to correspond to a second set of the SENSE AMPLIFIER circuitries.

The WORDLINE DRIVER circuitry (i.e., row-driver circuitry) includes regions 31 labeled SWD-L and regions 33 labeled SWD-U. The acronym SWD stands for sub-wordline-driver, and is utilized to emphasize that the components SWD-L and SWD-U are portions of the general WORDLINE DRIVER circuitry. The WORDLINE DRIVER circuitries SWD-L are utilized during operation of the memory cells associated with the lower deck 14, and the WORDLINE DRIVER circuitries SWD-U are utilized during operation of the memory cells associated with the upper deck 16.

In some embodiments, the wordline-driver-circuitries SWD-L and SWD-U may be considered to be paired with one another and distributed as structures 30.

The structures (blocks) 24 and 30 may be considered to form patch regions. The patch regions may be considered together to form a quilted arrangement of the circuit subunits along the base 12. Example patch regions are described in more detail below with reference to FIGS. 7 and 8.

Still referring to FIG. 4, first digit lines D0, D1 and D2 are associated with the first memory array (ARRAY-1). The first digit lines D0, D1 and D2 extend along the first memory array (ARRAY-1) and are coupled with first memory cells 20a of the first memory array. The digit lines D0, D1 and D2 are laterally spaced from one another, and may be representative of a large number of substantially identical digit lines extending across the first memory array; with the term "substantially identical" meaning identical to within reasonable tolerances of fabrication and measurement. The first digit lines alternate between even first digit lines and odd first digit lines, with the digit lines D0 and D2 being representative of even first digit lines, and the digit line D1 being representative of an odd first digit line. The even first digit lines (e.g., D0) are coupled with the first SENSE AMPLIFIER circuitry 26 (i.e., SA-E), and the odd first digit lines (e.g., D1) are coupled with the second SENSE AMPLIFIER circuitry 28 (i.e., SA-O). The first digit lines D0 and D2 have first portions along the first deck 14, and have second portions along the second deck 16. The first digit line D1 has a portion along the first deck 14, but does not have a portion along the second deck 16.

Second digit lines D0*, D1* and D2* are associated with the second memory array (ARRAY-2). The second digit lines D0*, D1* and D2* extend along the second memory array and are coupled with second memory cells 20b of the second memory array (ARRAY-2). The digit lines D0*, D1* and D2* are laterally spaced from one another, and may be representative of a large number of substantially identical digit lines extending across the second memory array. The second digit lines alternate between even second digit lines and odd second digit lines, with the digit lines D0* and D2* being representative of even second digit lines, and the digit line D1* being representative of an odd second digit line. The even second digit lines (e.g., D0*) are coupled with the first SENSE AMPLIFIER circuitry 26 (SA-E), and the odd second digit lines (e.g., D1*) are coupled with the second SENSE AMPLIFIER circuitry 28 (SA-O). The second digit lines D0* and D2* have first portions along the first deck 14, and have second portions along the second deck 16. The second digit line D2* has a portion along the second deck 16, but does not have a portion along the first deck 14.

The even first digit lines D0 and D2 are comparatively coupled with the even second digit lines D0* and D2* through the first SENSE AMPLIFIER circuitry 26 (SA-E); and the odd first digit line D1 is comparatively coupled with the odd second digit line D1* through the second SENSE AMPLIFIER circuitry 28 (SA-O). For purposes of understanding this disclosure and the claims that follow, a first digit line is "comparatively coupled" with a second digit line through a SENSE AMPLIFIER circuitry if the SENSE AMPLIFIER circuitry is configured to compare electrical properties (e.g., voltage) of the first and second digit lines with one another.

Two digit lines which are comparatively coupled with one another through SENSE AMPLIFIER circuitry may be considered to include a true digit line and a complementary digit line. For instance, the digit lines D0 and D0* may be considered to be a true digit line and a complementary digit line, respectively; and similarly the digit lines D1 and D1* may be considered to be a true digit line and a complementary digit line, respectively. The terms "true" and "complementary" are arbitrary. The electrical values of the true and complementary digit lines of the set are utilized together during reading/writing operations of memory cells (e.g., 20a, 20b) associated with such set. For purposes of describing the embodiments herein, the true digit lines will be those indicated without an asterisk in the label (e.g., D0, D1, D2, etc.), and the complementary digit lines will be those indicated with an asterisk in the label (e.g., D0*, D1*, D2*, etc.).

Referring still to FIG. 4, wordlines 32 extend along the first and second memory arrays (ARRAY-1 and ARRAY-2).

Each of the first memory cells 20a within the first memory array (ARRAY-1) is uniquely addressed by one of the digit lines extending along the first memory array (e.g., one of the digit lines D0, D1 and D2), and one of the wordlines 32. Similarly, each of the memory cells 20b within the second memory array (ARRAY-2) is uniquely addressed by one of the digit lines extending along the second memory array (e.g., one of the digit lines D0*, D1* and D2*), and one of the wordlines 32. In some embodiments, the digit lines along the first memory array (ARRAY-1) may be referred to as a first set of digit lines, while the digit lines along the second memory (ARRAY-2) are referred to as a second set of digit lines.

An advantage of the configuration of FIG. 4 is that all of the SENSE AMPLIFIER circuitry and all of the WORDLINE DRIVER circuitry may be provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the SENSE AMPLIFIER circuitry and/or at least some of the WORDLINE DRIVER circuitry is not directly under a memory array. The vertical stacking of regions of the memory arrays (ARRAY-1 and ARRAY-2) may further conserve valuable semiconductor real estate. In the illustrated embodiment of FIG. 4, the digit lines D0, D0*, D1, D1*, D2 and D2* are all vertically displaced relative to the first and second SENSE AMPLIFIER circuitries SA-E and SA-O, and are vertically displaced relative to the WORDLINE DRIVER circuitries SWD-U and SWD-L.

Figure 5:
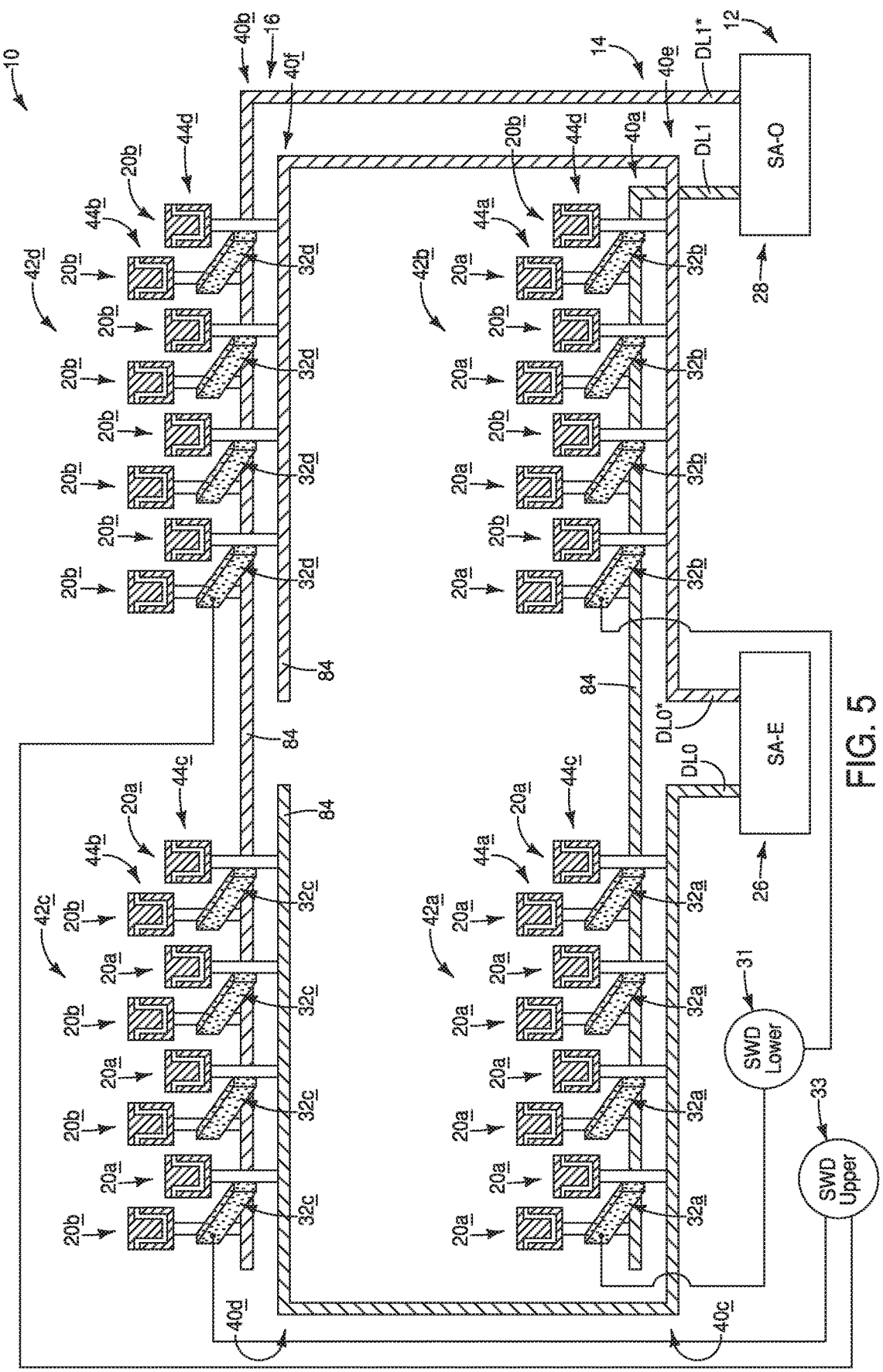
FIG. 5 is a diagrammatic multi-dimensional side view of an example layout of folded digit lines within the example decks of FIG. 4.
Figure 5A:
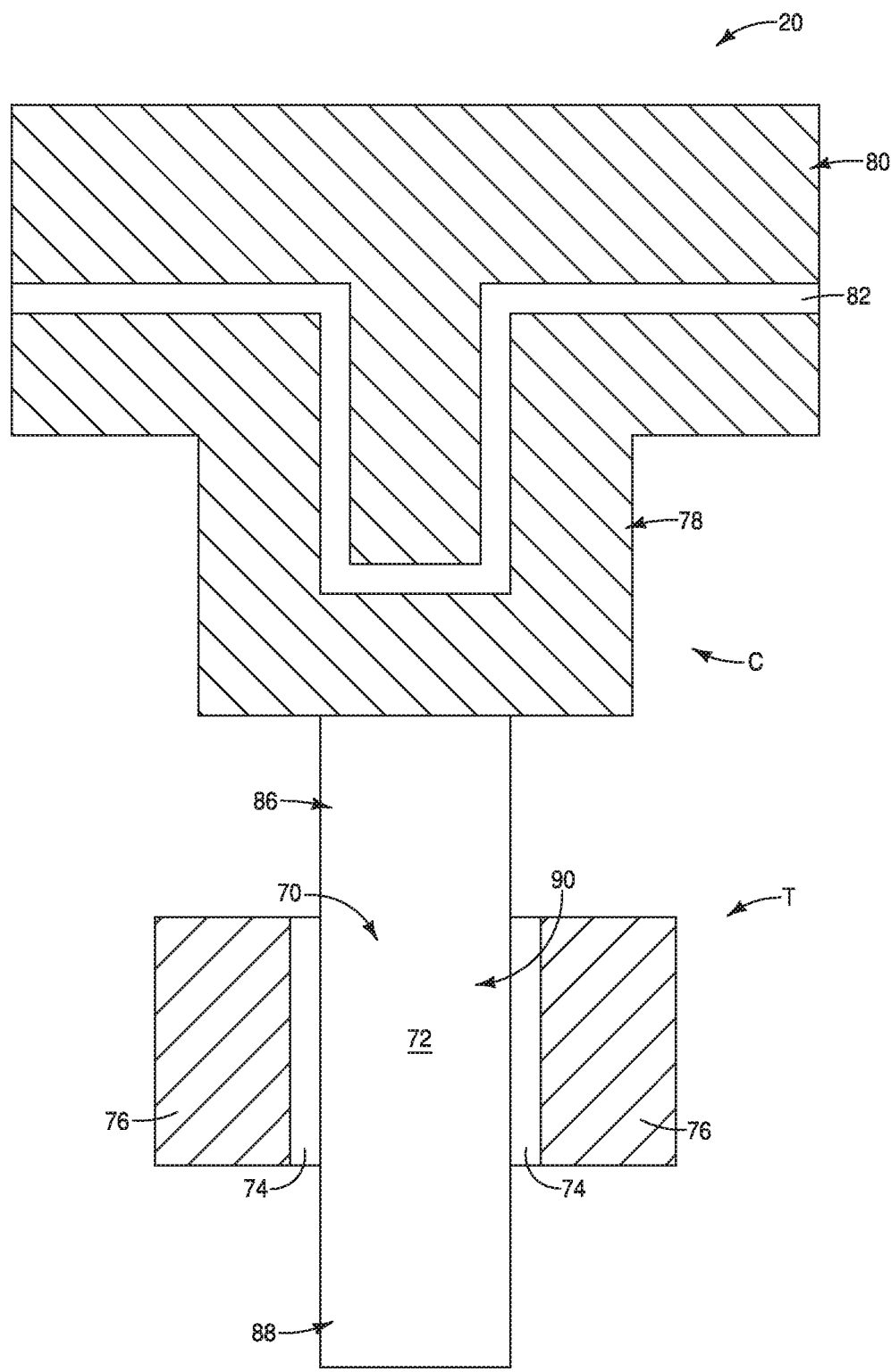
FIG. 5A is a diagrammatic side view of one of the memory cells of FIG. 5.

FIG. 5 shows a region of an example integrated assembly 10 in accordance with an example embodiment. The assembly 10 includes paired digit lines DL1 and DL1* which are comparatively coupled to one another through SENSE AMPLIFIER circuitry 28 (SA-O). The digit line DL1 may be referred to as the true digit line, and the digit line DL1* may be referred to as the complementary digit line. In some embodiments, the digit lines DL1 and DL1* may be referred to as first digit lines to distinguish them from other digit lines shown in FIG. 5; and in such embodiments the digit line DL1 may be referred to as a first true digit line, and the digit line DL1* may be referred to as a first complementary digit line. In some embodiments, the digit lines DL1 and DL1* may be referred to as a first set of true and complementary digit lines, with such first set corresponding to digit lines compared to one another through SA-O circuitry (and the SA-O circuitry may be considered to be a first set of SENSE AMPLIFIER circuitry). The SENSE AMPLIFIER circuitry 28 is associated with (along) the base 12.

The base 12, first deck 14 and second deck 16 are diagrammatically represented in FIG. 5 with different elevational levels. The true digit line DL1 is illustrated to have a region 40a along (associated with) the first deck (lower deck) 14, and to have no region along the second deck (upper deck) 16. The complementary digit line DL1* is illustrated to have a region 40b along (associated with) the second deck (upper deck) 16, and to have no region along the first deck 14. The regions 40a and 40b may be referred to as first and second regions, respectively.

The assembly 10 also includes paired digit lines DL0 and DL0* which are comparatively coupled to one another through SENSE AMPLIFIER circuitry 26 (SA-E). The digit line DL0 may be referred to as a second true digit line, and the digit line DL0* may be referred to as a second complementary digit line. In some embodiments, the digit lines DL0 and DL0* may be referred to as a second set of true and complementary digit lines, with such second set corresponding to digit lines compared to one another through SA-E circuitry (and the SA-E circuitry may be considered to be a second set of SENSE AMPLIFIER circuitry). The SENSE AMPLIFIER circuitry 26 is associated with (along) the base 12.

The second true digit line DL0 is illustrated to have a third region 40c along (associated with) the first deck (lower deck) 14 and a fourth region 40d along (associated with) the second deck (upper deck) 16. The second complementary digit line DL0* is illustrated to have a fifth region 40e along (associated with) the first deck (lower deck) 14 and a sixth region 40f along (associated with) the second deck (upper deck) 16.

The first region 40a of the first true digit line DL1 may be considered to be subdivided amongst a first segment 42a and a second segment 42b, with the first segment 42a being laterally adjacent the third region 40c of the second true digit line DL0 and the second segment 42b being laterally adjacent the fifth region 40e of the second complementary digit line DL0*.

The second region 40b of the first complementary digit line DL1* may be considered to be subdivided amongst a third segment 42c and a fourth segment 42d, with the third segment 42c being laterally adjacent the fourth region 40d of the second true digit line DL0 and the fourth segment 42d being laterally adjacent the sixth region 40f of the second complementary digit line DL0*.

Example memory cells 20a and 20b are shown along elevational levels corresponding to the decks 14 and 16, and wordlines 32 are also shown along the elevational levels corresponding to the decks 14 and 16. Each of the memory cells 20a of ARRAY-1 (with ARRAY-1 being described in FIG. 3) is uniquely addressed by a true digit line (DL0 or DL1) and a wordline 32. Similarly, each of the memory cells 20b of ARRAY-2 (with ARRAY-1 being described in FIG. 3) is uniquely addressed by a complementary digit line (DL1* or DL0*) and a wordline 32. The wordlines extend along rows of the memory cells 20a/20b.

A first set of the wordlines is labeled as wordlines 32a, and such wordlines extend from memory cells 20a along the first segment 42a of the first true digit line DL1 to memory cells 20a along the third region 40c of the second true digit line DL0.

A second set of the wordlines is labeled as wordlines 32b, and such wordlines extend from memory cells 20a along the second segment 42b of the first true digit line DL1 to memory cells 20b along the fifth region 40e of the second complementary digit line DL0*.

A third set of the wordlines is labeled as wordlines 32c, and such wordlines extend from memory cells 20b along the third segment 42c of the first complementary digit line DL1* to memory cells 20a along the fourth region 40d of the second true digit line DL0.

A fourth set of the wordlines is labeled as wordlines 32d, and such wordlines extend from memory cells 20b along the fourth segment 42d of the first complementary digit line DL1* to memory cells 20b along the sixth region 40f of the second complementary digit line DL0*.

The terms "first", "second", "third" and "fourth" are arbitrary in describing the wordlines 32a, 32b, 32c and 32d, and are utilized simply to distinguish the wordlines from one another. The terms "first", "second", "third" and "fourth" may be used to refer to, and distinguish, any of the wordlines 32a, 32b, 32c and 32d in any desired order in various embodiments. For instance, in some embodiments the wordlines 32a, 32c, 32b and 32d may be referred to as the first, second, third and fourth wordlines, respectively.

The memory cells 20a along the first true digit line DL1 may be considered to be a first set 44a of the memory cells, the memory cells 20b along the first complementary digit line DL1* may be considered to be a second set 44b of the memory cells, the memory cells 20a along the second true digit line DL0 may be considered to be a third set 44c of the memory cells, and the memory cells 20b along the second complementary digit line DL0* may be considered to be a fourth set 44d of the memory cells. The memory cells of the first set 44a are only along the lower deck 14, and the memory cells of the second set 44b are only along the upper deck 16. In contrast, the memory cells of the third set 44c are along both of the decks 14 and 16, and the memory cells of the fourth set 44d are also along both of the decks 14 and 16.

WORDLINE DRIVER circuitries (SWD Upper and SWD Lower) may be supported by the base 12 and may be coupled with the wordlines 32. A few example connections to the WORDLINE DRIVER circuitries are shown in FIG. 5. Most connections to the WORDLINE DRIVER circuitries are not shown in FIG. 5 to simplify the drawing. The illustrated connections show that the lower wordlines 32a and 32b are coupled to the SWD Lower circuitry 31, and the upper wordlines 32c and 32d are coupled to the SWD Upper circuitry 33. The circuitries 31 and 33 may be different from one another and laterally spaced from one another along the base 12. Such is indicated in FIGS. 4 and 5, and is described in more detail below with reference to FIGS. 7 and 8.

The memory cells 20a and 20b may have any suitable configuration. An example memory cell 20 is shown in enlarged view in FIG. 5B to simplify the labeling of the components of the memory cell. The memory cell 20 includes a transistor T coupled with a capacitor C. The transistor T comprises a vertically-extending pillar 70 of semiconductor material 72. The semiconductor material 72 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Gate dielectric material (insulative material) 74 is along sidewalls of the pillar 70, and conductive gate material 76 is along the gate dielectric material.

The gate dielectric material 74 may comprise any suitable composition(s); and in some embodiments may comprise, consist essentially of, or consist of silicon dioxide.

The conductive gate material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate material 76 forms the transistor gate of the transistor T. The transistor includes a first source/drain region 86 within an upper region of the pillar 70, a second source/drain region 88 within a lower region of the pillar 70, and a channel region 90 between the first and second source/drain regions 86 and 88. In operation, an electrical field generated by voltage within the gate material 76 (i.e., voltage along a wordline 32 coupled with the gate material 76) may gatedly couple the source/drain regions 86 and 88 to one another through the channel region 90. When the term "gated coupling" is utilized herein, such may refer to the controlled coupling/decoupling of source/drain regions of a transistor that may be induced by electrical activation/deactivation of the gate of the transistor.

The capacitor C comprises a first conductive node 78, a second conductive node 80, and an insulative material (capacitor dielectric material) 82 between the first and second conductive nodes.

The first and second conductive nodes 78 and 80 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 82 may comprise any suitable composition(s), and in some embodiments may comprise, consist essentially of, or consist of silicon dioxide.

In the shown embodiment, the lower conductive node 78 is configured as an upwardly-opening container. In other embodiments, the lower conductive node may have another suitable shape. In the shown embodiment in which the lower conductive node 78 is configured as an upwardly-opening container, the dielectric material 82 and the upper node 80 extend into the upwardly-opening container of the lower node 78.

The capacitor C is an example storage element coupled with the transistor T. In other embodiments, other suitable storage elements may be utilized in place of the capacitor C. Suitable storage elements may be devices having at least two detectable states; and in some embodiments a suitable storage element may be, for example, a resistive-memory device, a conductive-bridging device, a phase-change-memory (PCM) device, a programmable metallization cell (PMC), etc.

The digit lines DL0, DL0*, DL1 and DL1* of FIG. 5 comprise conductive material 84. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

An advantage of the configuration of FIG. 5 is that each of the odd digit lines (DL1 and DL1*) has a first portion adjacent a region of one of the even digit lines (e.g., the odd digit line DL1 has a first portion 42a adjacent the even digit line DL0), and has a second portion adjacent a region of a complement to said one of the even digit lines (e.g., the odd digit line DL1 has a second portion 42b adjacent the even digit line DL0*). Such may enable noise along the adjacent digit lines DL1, DL0, DL1* and DL0* to be canceled during a differential sensing operation (with example noise being noise resulting from capacitive coupling). Accordingly, the configuration of FIG. 5 may advantageously reduce problematic noise (e.g., noise resulting from capacitive coupling) between adjacent digit lines.

Figure 6:
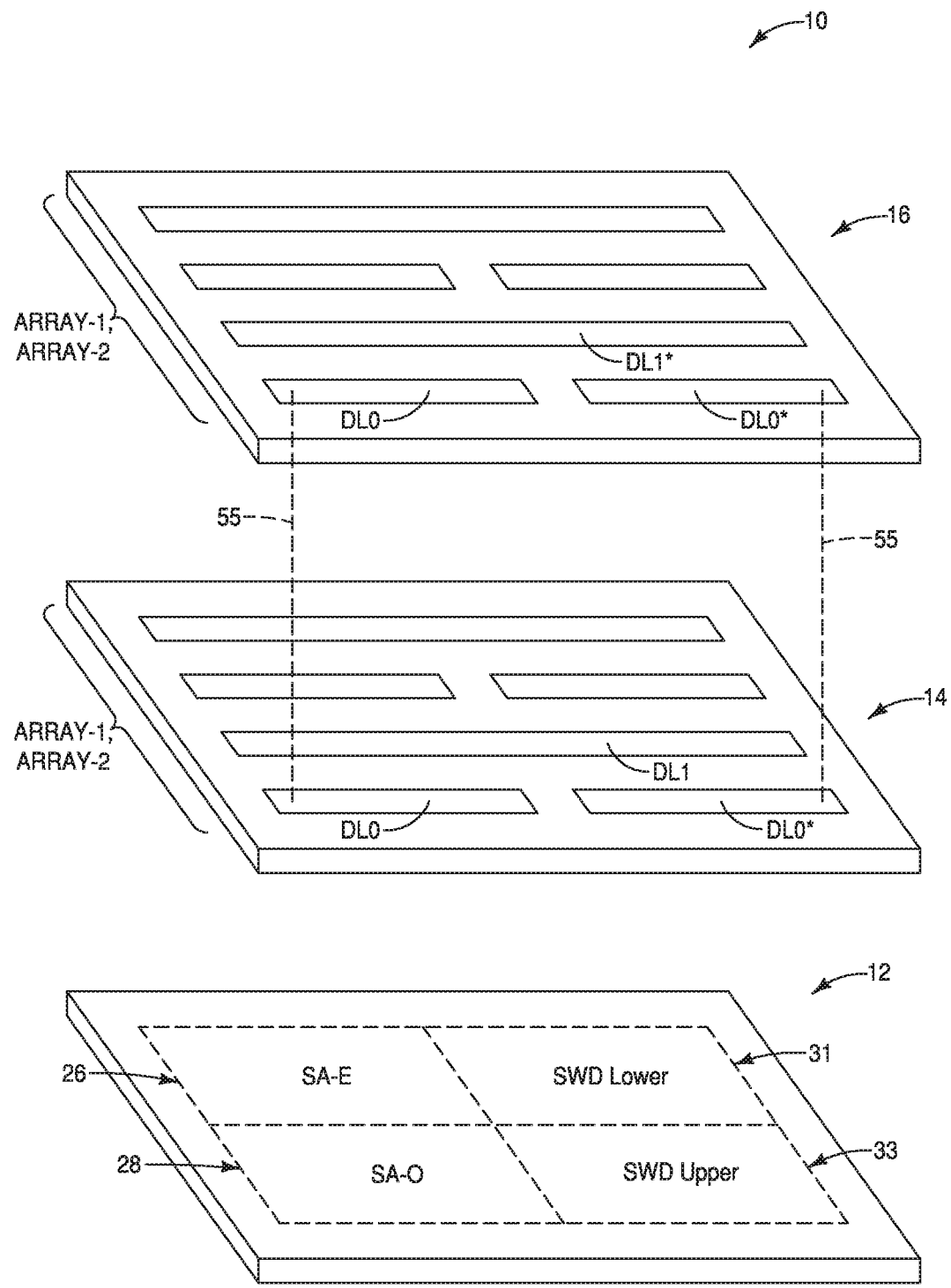
FIG. 6 is a multi-dimensional view of a region of an assembly comprising the layout of FIG. 5.
Figure 7:
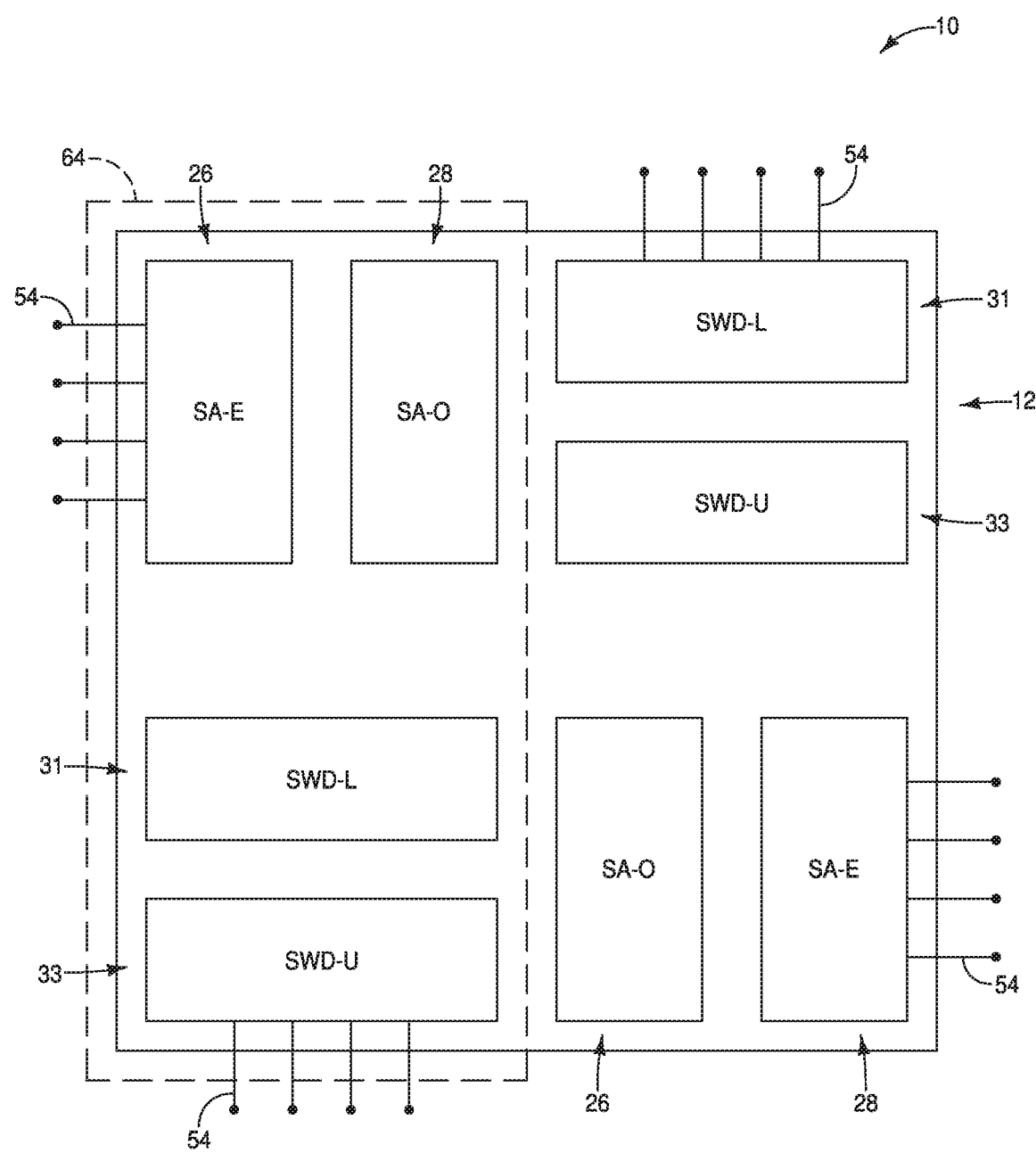
FIG. 7 is a diagrammatic top-down view of an example region of an example assembly.

FIG. 6 shows an alternative view of the assembly 10 of FIG. 5. Specifically, each of the decks 14 and 16 is diagrammatically illustrated over the base 12, and regions of the digit lines DL0, DL0*, DL1 and DL1* are diagrammatically illustrated as being associated with the decks 14 and 16. Additional digit lines are shown, but are not labeled.

Connections between the regions of the digit lines along the upper deck 16 with the regions of the digit lines along the lower deck 14 are diagrammatically illustrated with dashed lines 55.

The SENSE AMPLIFIER circuitries 26 and 28, and the WORDLINE DRIVER circuitries 31 and 33, are diagrammatically illustrated as being along the base 12; and as being under the memory arrays (ARRAY-1 and ARRAY-2) associated with the decks 14 and 16.

The configurations described above with reference to FIGS. 5 and 6 may have SENSE AMPLIFIER circuitries and WORDLINE DRIVER circuitries distributed in any suitable arrangement along the base 12. An example arrangement is described with reference to FIG. 7. Such example arrangement includes repeating patches (with an example patch being identified as a patch 64). Each patch includes SENSE AMPLIFIER circuitry (SA-E and SA-O), and includes WORDLINE DRIVER circuitry (SWD-L and SWD-U). Example wiring 54 (only some of which is labeled) is shown arranged for coupling various SENSE AMPLIFIER circuitries and WORDLINE DRIVER circuitries to elements outside of the indicated patches.

Figure 8:
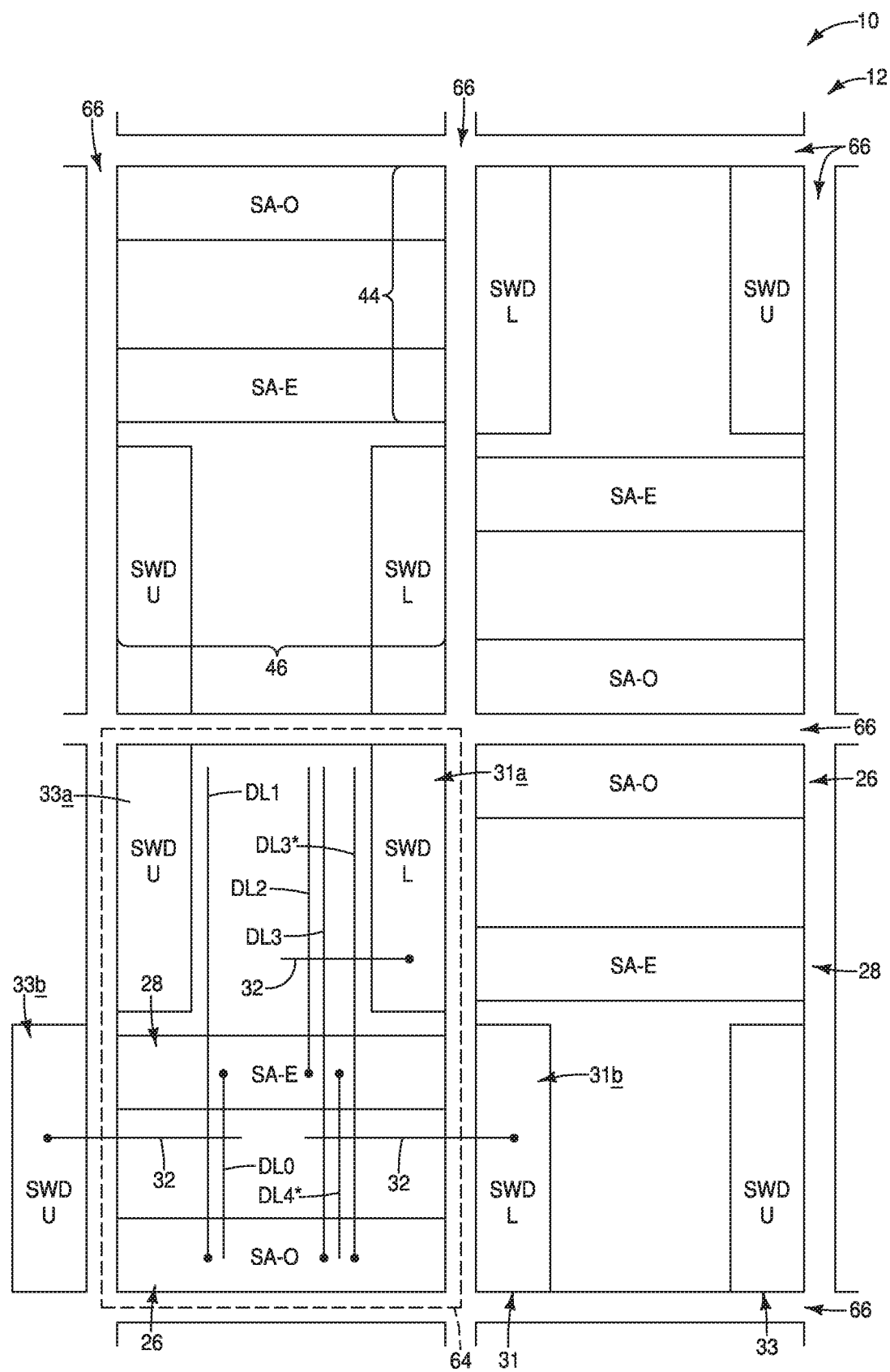
FIG. 8 is a diagrammatic top-down view of an example region of an example assembly.

Another example arrangement of the SENSE AMPLIFIER circuitries and WORDLINE DRIVER circuitries along the base 12 is illustrated in FIG. 8. The WORDLINE DRIVER circuitries (SWD-U and SWD-L) are laterally offset relative to the SENSE AMPLIFIER circuitries (SA-E and SA-O). In some embodiments, the WORDLINE DRIVER circuitries may be considered to be within second areas 46 of the base 12, and the SENSE AMPLIFIER circuitries may be considered to be within first areas 44 of such base. The second areas are laterally offset from the first areas. In some embodiments, at least some of the first and second areas may be directly under first and second memory cells of the first and second memory arrays as is indicated above in FIGS. 4 and 6.

Example wordlines 32 and digit lines DL0, DL1, DL2, DL3, DL3* and DL4* are shown superimposed on the base 12 of FIG. 8 to assist the reader in understanding example relationships between the wordlines and digit lines. The wordlines and digit lines would be along decks above the base 12, rather than being along the base 12, as is indicated in FIGS. 4, 5 and 6.

The SA-E circuitries 28 may be considered to be first SENSE AMPLIFIER circuitries, and the SA-O circuitries 26 may be considered to be second SENSE AMPLIFIER circuitries. In the shown embodiment, the second SENSE AMPLIFIER circuitries are laterally displaced from the first SENSE AMPLIFIER circuitries. The SWD-U circuitries 33 may be considered to be first WORDLINE DRIVER circuitries, and the SWD-L circuitries 31 may be considered to be second WORDLINE DRIVER circuitries. In the shown embodiment, the second WORDLINE DRIVER circuitries are laterally displaced from the first WORDLINE DRIVER circuitries. The first and second SENSE AMPLIFIER circuitries 26 and 28 within the patch 64 are associated with circuitry represented by the digit lines DL0, DL1, DL2, DL3, DL3* and DL4*. Two sets of WORDLINE DRIVER circuitries are also associated with such circuitry. One of such sets includes SWD-L labeled as 31a and SWD-U labeled as 33a. Such set is along regions of the base 12 which are adjacent one side of the SA-E circuitry 28 within the patch 64. The other of the sets of the WORDLINE DRIVER circuitries includes SWD-L labeled as 31b and SWD-U labeled as 33b. Such set is along regions of the base 12 which are adjacent edges of both of the SA-E and SA-O circuitries within the patch 64.

The illustrated embodiment of FIG. 8 shows socket regions 66 along edges of the patches, with such socket regions enabling the passing of interconnects along edges of circuitry associated with the patches.

Although the embodiments described herein indicate that there are two memory decks (14, 16) over a base 12, it is to be understood that in other embodiments there may be more than two memory decks over the base.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck and a second deck over the first deck. A first true digit line has a first region along the first deck. The first region has a first segment and a second segment. A first complementary digit line has a second region along the second deck. The second region has a third segment and a fourth segment. The first true digit line is comparatively compared to the first complementary digit line through first SENSE AMPLIFIER circuitry. A second true digit line has a third region along the first deck and a fourth region along the second deck. The third region is laterally adjacent the first segment of the first region of the first true digit line, and the fourth region is laterally adjacent the third segment of the second region of the first complementary digit line. A second complementary digit line has a fifth region along the first deck and has a sixth region along the second deck. The fifth region is laterally adjacent the second segment of the first region of the first true digit line, and the sixth region is laterally adjacent the fourth segment of the second region of the first complementary digit line. The second true digit line is comparatively compared to the second complementary digit line through second SENSE AMPLIFIER circuitry.

Some embodiments include an integrated assembly comprising a base comprising first and second SENSE AMPLIFIER circuitries, a first deck over the base, and a second deck over the first deck. A first true digit line has a first region along the first deck. The first region has a first segment and a second segment. A first complementary digit line has a second region along the second deck. The second region has a third segment and a fourth segment. The first true digit line is comparatively compared to the first complementary digit line through the first SENSE AMPLIFIER circuitry. A second true digit line a has a third region along the first deck and a fourth region along the second deck. The third region is laterally adjacent the first segment of the first region of the first true digit line, and the fourth region is laterally adjacent the third segment of the second region of the first complementary digit line. A second complementary digit line has a fifth region along the first deck and has a sixth region along the second deck. The fifth region is laterally adjacent the second segment of the first region of the first true digit line, and the sixth region is laterally adjacent the fourth segment of the second region of the first complementary digit line. The second true digit line is comparatively compared to the second complementary digit line through the second SENSE AMPLIFIER circuitry. First wordlines extend from memory cells along the third region of the second true digit line to memory cells along the first segment of the first region of the first true digit line. Second wordlines extend from memory cells along the fourth region of the second true digit line to memory cells along the third segment of the second region of the first complementary digit line. Third wordlines extend from memory cells along the fifth region of the second complementary digit line to memory cells along the second segment of the first region of the first true digit line. Fourth wordlines extend from memory cells along the sixth region of the second complementary digit line to memory cells along the fourth segment of the second region of the first complementary digit line.

Some embodiments include an integrated assembly having a base comprising SENSE AMPLIFIER circuitries, a first deck over the base, a second deck over the first deck, a first set of true and complementary digit lines, and a second set of true and complementary digit lines. The true digit lines of the first set are comparatively coupled to the complementary digit lines of the first set through a first set of the SENSE AMPLIFIER circuitries. The true digit lines of the first set are associated with a first set of memory cells. The memory cells of the first set are only along the first deck. The complementary digit lines of the first set are associated with a second set of memory cells. The memory cells of the second set are only along the second deck. The true digit lines of the second set are comparatively coupled to the complementary digit lines of the second set through a second set of the SENSE AMPLIFIER circuitries. The true digit lines of the second set are associated with a third set of memory cells. Some of said memory cells of the third set are along the first deck and others of the memory cells of the third set are along the second deck. The complementary digit lines of the first set are associated with a fourth set of memory cells. Some of said memory cells of the fourth set are along the first deck and others of the memory cells of the fourth set are along the second deck. First wordlines extend between the memory cells of the first set and the memory cells of the third set. Second wordlines extend between the memory cells of the first set and the memory cells of the fourth set. Third wordlines extend between the memory cells of the second set and the memory cells of the third set. Fourth wordlines extend between the memory cells of the second set and the memory cells of the fourth set.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first deck;
   a second deck over the first deck;
   a first true digit line having a first region along the first deck, the first region having a first segment and a second segment;
   a first complementary digit line having a second region along the second deck; the second region having a third segment and a fourth segment; the first true digit line being comparatively compared to the first complementary digit line through first SENSE AMPLIFIER circuitry;
a second true digit line having a third region along the first deck and a fourth region along the second deck; the third region being laterally adjacent the first segment of the first region of the first true digit line, and the fourth region being laterally adjacent the third segment of the second region of the first complementary digit line; and
a second complementary digit line having a fifth region along the first deck and having a sixth region along the second deck; the fifth region being laterally adjacent the second segment of the first region of the first true digit line, and the sixth region being laterally adjacent the fourth segment of the second region of the first complementary digit line; the second true digit line being comparatively compared to the second complementary digit line through second SENSE AMPLIFIER circuitry.

2. The integrated assembly of claim 1 wherein wordlines extend from memory cells along the third region of the second true digit line to memory cells along the first segment of the first region of the first true digit line.

3. The integrated assembly of claim 1 wherein wordlines extend from memory cells along the fourth region of the second true digit line to memory cells along the third segment of the second region of the first complementary digit line.

4. The integrated assembly of claim 1 wherein wordlines extend from memory cells along the fifth region of the second complementary digit line to memory cells along the second segment of the first region of the first true digit line.

5. The integrated assembly of claim 1 wherein wordlines extend from memory cells along the sixth region of the second complementary digit line to memory cells along the fourth segment of the second region of the first complementary digit line.

6. An integrated assembly, comprising:
a base comprising first and second SENSE AMPLIFIER circuitries;
a first deck over the base;
a second deck over the first deck;
a first true digit line having a first region along the first deck, the first region having a first segment and a second segment;
a first complementary digit line having a second region along the second deck; the second region having a third segment and a fourth segment; the first true digit line being comparatively compared to the first complementary digit line through the first SENSE AMPLIFIER circuitry;
a second true digit line a having a third region along the first deck and having a fourth region along the second deck; the third region being laterally adjacent the first segment of the first region of the first true digit line, and the fourth region being laterally adjacent the third segment of the second region of the first complementary digit line;
a second complementary digit line having a fifth region along the first deck and having a sixth region along the second deck; the fifth region being laterally adjacent the second segment of the first region of the first true digit line, and the sixth region being laterally adjacent the fourth segment of the second region of the first complementary digit line; the second true digit line being comparatively compared to the second complementary digit line through the second SENSE AMPLIFIER circuitry;
first wordlines extending from memory cells along the third region of the second true digit line to memory cells along the first segment of the first region of the first true digit line;
second wordlines extending from memory cells along the fourth region of the second true digit line to memory cells along the third segment of the second region of the first complementary digit line;
third wordlines extending from memory cells along the fifth region of the second complementary digit line to memory cells along the second segment of the first region of the first true digit line; and
fourth wordlines extending from memory cells along the sixth region of the second complementary digit line to memory cells along the fourth segment of the second region of the first complementary digit line.

7. The integrated assembly of claim 6 wherein the memory cells include capacitors.

8. The integrated assembly of claim 7 wherein bottom electrodes of the capacitors are configured as upwardly-opening containers.

9. The integrated assembly of claim 6 wherein the first wordlines are coupled with first WORDLINE DRIVER circuitry and the second wordlines are coupled with second WORDLINE DRIVER circuitry which is different from the first WORDLINE DRIVER circuitry.

10. The integrated assembly of claim 6 wherein the third wordlines are coupled with the first WORDLINE DRIVER circuitry and the fourth wordlines are coupled with the second WORDLINE DRIVER circuitry.

11. The integrated assembly of claim 6 wherein:
the first SENSE AMPLIFIER circuitry is laterally offset from the second SENSE AMPLIFIER circuitry along the base;
the first wordlines are coupled with first WORDLINE DRIVER circuitry, and the second wordlines are coupled with second WORDLINE DRIVER circuitry which is different from the first WORDLINE DRIVER circuitry; and
the first and second WORDLINE DRIVER circuitries are within regions along the base which are along one side of the first and second SENSE AMPLIFIER circuitries.

12. The integrated assembly of claim 11 wherein the memory cells along the first and second true digit lines are within a first memory array and the memory cells along the first and second complementary digit lines are within a second memory array; and wherein at least a portion of one or more of the first and second WORDLINE DRIVER circuitries and the first and second SENSE AMPLIFIER circuitries is directly under the first and second memory arrays.

13. The integrated assembly of claim 11 wherein the memory cells along the first and second true digit lines are within a first memory array and the memory cells along the first and second complementary digit lines are within a second memory array; and wherein the first and second WORDLINE DRIVER circuitries and the first and second SENSE AMPLIFIER circuitries are entirely directly under the first and second memory arrays.

14. The integrated assembly of claim 6 wherein:
the first SENSE AMPLIFIER circuitry is laterally offset from the second SENSE AMPLIFIER circuitry along the base;

the first wordlines are coupled with first WORDLINE DRIVER circuitry, and the second wordlines are coupled with second WORDLINE DRIVER circuitry which is different from the first WORDLINE DRIVER circuitry; and the first and second WORDLINE DRIVER circuitries are within regions along the base which are along edges of both of the first and second SENSE AMPLIFIER circuitries.

15. The integrated assembly of claim 14 wherein the memory cells along the first and second true digit lines are within a first memory array and the memory cells along the first and second complementary digit lines are within a second memory array; and wherein at least a portion of one or more of the first and second WORDLINE DRIVER circuitries and the first and second SENSE AMPLIFIER circuitries is directly under the first and second arrays.

16. An integrated assembly, comprising:
a base comprising SENSE AMPLIFIER circuitries;
a first deck over the base;
a second deck over the first deck;
a first set of true and complementary digit lines; the true digit lines of the first set being comparatively coupled to the complementary digit lines of the first set through a first set of the SENSE AMPLIFIER circuitries; the true digit lines of the first set being associated with a first set of memory cells, said memory cells of the first set being only along the first deck; the complementary digit lines of the first set being associated with a second set of memory cells, said memory cells of the second set being only along the second deck;
a second set of true and complementary digit lines; the true digit lines of the second set being comparatively coupled to the complementary digit lines of the second set through a second set of the SENSE AMPLIFIER circuitries; the true digit lines of the second set being associated with a third set of memory cells, some of said memory cells of the third set being along the first deck and others of said memory cells of the third set being along the second deck; the complementary digit lines of the first set being associated with a fourth set of memory cells, some of said memory cells of the fourth set being along the first deck and others of said memory cells of the fourth set being along the second deck;

first wordlines extending between the memory cells of the first set and the memory cells of the third set;
second wordlines extending between the memory cells of the first set and the memory cells of the fourth set;
third wordlines extending between the memory cells of the second set and the memory cells of the third set; and
fourth wordlines extending between the memory cells of the second set and the memory cells of the fourth set.

17. The integrated assembly of claim 16 wherein the first wordlines are coupled with first WORDLINE DRIVER circuitry, and wherein the third wordlines are coupled with second WORDLINE DRIVER circuitry which is different from the first WORDLINE DRIVER circuitry.

18. The integrated assembly of claim 16 wherein the first wordlines are coupled with first WORDLINE DRIVER circuitry, and wherein the fourth wordlines are coupled with second WORDLINE DRIVER circuitry which is different from the first WORDLINE DRIVER circuitry.

19. The integrated assembly of claim 16 wherein the second wordlines are coupled with first WORDLINE DRIVER circuitry, and wherein the third wordlines are coupled with second WORDLINE DRIVER circuitry which is different from the first WORDLINE DRIVER circuitry.

20. The integrated assembly of claim 16 wherein the second wordlines are coupled with first WORDLINE DRIVER circuitry, and wherein the fourth wordlines are coupled with second WORDLINE DRIVER circuitry which is different from the first WORDLINE DRIVER circuitry.

21. The integrated assembly of claim 16 wherein the first and second wordlines are coupled with first WORDLINE DRIVER circuitry, and wherein the third and fourth wordlines are coupled with second WORDLINE DRIVER circuitry which is different from the first WORDLINE DRIVER circuitry.

22. The integrated assembly of claim 16 wherein the memory cells comprise storage elements.

23. The integrated assembly of claim 16 wherein the memory cells comprise capacitors.

24. The integrated assembly of claim 23 wherein the capacitors have bottom electrodes shaped as upwardly-opening containers, and have dielectric material and top electrodes extending into said upwardly-opening containers.

* * * * *